US012603246B2

(12) United States Patent
Rossek

(10) Patent No.: US 12,603,246 B2
(45) Date of Patent: Apr. 14, 2026

(54) DETECTOR AND METHOD FOR OBTAINING KIKUCHI IMAGES

(71) Applicant: Bruker Nano GmbH, Berlin (DE)

(72) Inventor: Uwe Rossek, Berlin (DE)

(73) Assignee: BRUKER NANO GMBH, Berlin (DE)

( * ) Notice: Subject to any disclaimer, the term of this patent is extended or adjusted under 35 U.S.C. 154(b) by 341 days.

(21) Appl. No.: 18/357,869

(22) Filed: Jul. 24, 2023

(65) Prior Publication Data

US 2024/0047174 A1 Feb. 8, 2024

(30) Foreign Application Priority Data

Jul. 26, 2022 (EP) ..................................... 22187005

(51) Int. Cl.
H01J 37/244 (2006.01)
G01N 23/203 (2006.01)
(Continued)

(52) U.S. Cl.
CPC .......... H01J 37/244 (2013.01); G01N 23/203 (2013.01); H01J 37/18 (2013.01); H01J 37/22 (2013.01); H01J 37/28 (2013.01)

(58) Field of Classification Search
CPC ............. G01N 23/00; G01N 23/20058; G01N 23/203; G01N 2223/306; G01N 2223/321; G01N 2223/401; G01N 2223/427; G01N 2223/604; H01J 37/00; H01J 37/02; H01J 37/18; H01J 37/22; H01J 37/244; H01J 37/26; H01J 37/28; H01J 2237/024; H01J 2237/2443; H01J 2237/2446; H01J 2237/24475; H01J 2237/2805
(Continued)

(56) References Cited

U.S. PATENT DOCUMENTS 5,466,934 A * 11/1995 Adams ................. G01N 23/203
250/307
2012/0025074 A1* 2/2012 Barbi .................. G01T 1/20188
250/361 R
(Continued)

FOREIGN PATENT DOCUMENTS

EP 3 644 341 A1 4/2020
EP 3 736 561 A1 11/2020
(Continued)

OTHER PUBLICATIONS

European Search Report for EP Application No. 22187005.8, Jan. 11, 2023, 11 pages.

*Primary Examiner* — Jason L McCormack
(74) *Attorney, Agent, or Firm* — Lewis Roca Rothgerber Christie LLP

(57) ABSTRACT

The present invention refers to a detector and a method for obtaining Kikuchi images by using electron backscatter diffraction (EBSD) or transmission Kikuchi diffraction (TKD) technique. In particular, the present invention refers to a detector comprising a detector body, a detector head with a scintillation screen and a photodetector with a active surface for detecting Kikuchi patterns, and means configured to move the detector head with respect to the detector body. The method comprises obtaining a first and a second Kikuchi pattern, and moving the detector head after obtaining the first Kikuchi pattern and prior obtaining the second Kikuchi pattern.

13 Claims, 3 Drawing Sheets

(51) Int. Cl.
  *H01J 37/18*        (2006.01)
  *H01J 37/22*        (2006.01)
  *H01J 37/28*        (2006.01)

(58) Field of Classification Search
  USPC ................................. 250/306, 307, 311, 310
  See application file for complete search history.

(56)                    References Cited

U.S. PATENT DOCUMENTS

| | | | |
|---|---|---|---|
| 2012/0161000 A1* | 6/2012 | Tateno | H01J 37/28 |
| | | | 250/361 R |
| 2019/0178639 A1* | 6/2019 | Gutman | G03F 7/70633 |
| 2019/0204245 A1 | 7/2019 | Otsuka et al. | |
| 2020/0135426 A1* | 4/2020 | Goran | H01J 37/20 |
| 2020/0333271 A1* | 10/2020 | Hendrich | H01J 37/285 |

FOREIGN PATENT DOCUMENTS

| | | |
|---|---|---|
| WO | WO 2017/104186 A1 | 6/2017 |
| WO | WO 2019/064013 A1 | 4/2019 |

\* cited by examiner

DETECTOR AND METHOD FOR OBTAINING KIKUCHI IMAGES

CROSS-REFERENCE TO RELATED APPLICATION(S)

This application claims priority to European Patent Application No. EP22187005.8, filed on Jul. 26, 2022, the entire content of which is incorporated herein by reference.

The present invention refers to a detector and a method for obtaining Kikuchi images by using electron backscatter diffraction (EBSD) or transmission Kikuchi diffraction (TKD) technique. In particular, the present invention refers to a detector and a method for obtaining Kikuchi images with an increased image section and an improved image resolution, thus, allowing for an improved analysis of the structure, crystal orientation, phase and strain in the sample under investigation.

TECHNOLOGICAL BACKGROUND

The structure of crystalline materials can be analyzed using diffraction methods, wherein suitable electromagnetic waves are coherently scattered by the atoms of the material. The direction-dependent intensity of the scattered radiation is then recorded at different scattering angles. Various information on the crystalline material, such as on the crystal structure, chemical bonds or mechanical strain within the sample, can be derived from the recorded angle-dependent intensity distribution of the diffracted waves of the applied radiation.

Suitable radiation can either be electromagnetic radiation, such as X-rays, or massive particle radiation, such as electron or neutron beams, as long as the wavelength of the radiation is within the magnitude of the lattice constant(s) of the structure(s) to be analyzed.

An analytic technique for measuring crystal orientation that can be integrated into an electron microscope is Kikuchi diffraction. This technique can be implemented as electron backscatter diffraction, which is also known as backscatter Kikuchi diffraction (BKD), or as transmission Kikuchi diffraction, also known as transmission electron backscatter diffraction (t-EBSD). In EBSD, backscatter electrons are detected upstream the sample with respect to a propagation direction of an initially incident electron beam, whereas in TKD transmitted and diffracted electrons are detected downstream the sample in this direction. Both implementations can be theoretically applied to any crystalline material and provide the absolute crystal orientation with sub-micron spatial resolution and phase information.

In general, Kikuchi diffraction can be utilized to provide information on the phase of a sample-region of a crystalline material, particularly on the crystal structure, such as e.g., bodycentered or face-centered cubic, orthorhombic or the like, and the spatial orientation of this crystal structure. Kikuchi diffraction can also reveal information on the strain in a material. In Kikuchi diffraction backscattered or transmitted electrons are diffracted by the periodic atomic lattice within the sample according to the Bragg condition before they exit the sample.

At least part of the scattered electrons thus exit the sample with an angle-dependent intensity distribution. If this intensity distribution is detected using a two-dimensional detector, a socalled Kikuchi pattern as illustrated in FIG. 1 is recorded as a gnomonic projection on the detector surface. The backscattering of the incident electrons takes place within a limited region near the incident electron beam position, wherein the position of this region with respect to the detector surface is the so-called pattern center. A typical feature of such Kikuchi patterns is the narrow Kikuchi bands with an angular width of two times the Bragg angle of the corresponding diffracting crystal planes. These bands result can be considered to be formed by the Kossel cone of the respective crystal plane intersecting with the detector. With an appropriate experimental setup, the Kikuchi bands extend linearly on the detector.

If the geometry of the experimental setup is well described, the Kikuchi bands can be related to the underlying crystal phase and orientation of the material within the source region. Each band present in an indexed Kikuchi pattern, i.e. crystal phase and orientation are known, can be indexed individually using the Miller indices. Theoretically, a minimum of three bands is necessary to determine the crystal orientation and phase represented by a given Kikuchi pattern. In practice more than three bands are required to unambiguously index a pattern. The minimum number of bands is decided by the user based on the number of crystal phases present and their symmetry, i.e. the higher the crystal symmetry and the larger the number of phases the higher the number of bands required for correctly index a specific pattern.

The accuracy in the determination of material properties like the crystal phase and orientation of the material is directly related to the quality of the Kikuchi image. The better the quality of the Kikuchi image, the more accurate the determination of the material properties.

It is thus an object of the invention to improve the quality of Kikuchi images.

DESCRIPTION OF THE INVENTION

The objective of the invention is solved by the detector of claim 1, the method of claim 9, and the detection system of claim 1.

An aspect of the invention relates to a detector for Kikuchi diffraction, particularly for electron backscatter diffraction, EBSD, or for transmission Kikuchi diffraction, TKD. The detector of the present invention shall be in principle usable for both of these measurement configurations, which differ mainly by the positioning of the detector surface relative to the sample position. Without being restricted thereto, in the following the detector of the invention is described with respect to EBSD where it is necessary or appropriate to specify this.

The detector of the present invention comprises a detector body, a detector head configured to detect incident backscattered electrons, means configured to move the detector head with respect to the detector body, and a control unit which is communicatively connected to the means.

In Kikuchi diffraction, the detector head is positioned near the sample either upstream (EBSD) or downstream (TKD) with respect to the incident electron beam. According to the present invention, incident backscattered electrons can be detected by the detector head of the detector. For this purpose, the detector comprises preferably either a direct electron detector or a scintillation screen together with a photodetector. The direct electron detector is directly exposed to the backscattered electron radiation, whereas the photodetector is configured to detect incident radiation from the scintillation screen. Both the direct electron detector and the photodetector are configured to detect Kikuchi patterns, and comprise a size, resolution and/or sensitivity that is suitable for detecting Kikuchi patterns. However, compared to a scintillation screen and a photodetector a direct electron detector may achieve higher detection quantum yields.

Preferably, the means configured to move the detector head with respect to the detector body are mechanical means configured to tilt, rotate or move the detector head linearly in up to three spatial directions leading to a well-defined movement of the detector head within a wide range, from micrometers, preferably, sub-micrometers to millimeters, preferably a few centimeters. The means preferably mount the detector head to the detector body.

The control unit enables precise and defined motion of the means and communicates with the latter either by wireless or wired connection. The control unit may comprise a processor, a memory and interfaces for further communication connections. The control unit may be housed by the detector body, the detector head or apart from them.

The detector body preferably comprises a body part which forms the main body of the detector body and preferably comprises a housing. The housing may enclose control electronics and/or means for cooling the detector.

The Kikuchi detector of the present invention can be advantageously used for detecting improved quality Kikuchi images with a scanning electron microscope (SEM). Particularly preferred, the detector body allows to be mounted to a SEM chamber port so that the detector head and the means for moving the detector head with respect to the detector body reach into the SEM chamber and the photodetector can be moved with respect to the sample under investigation, respectively, the electrons diffracted by the sample.

Thus, by obtaining at least two Kikuchi images from two different photodetector positions with respect to the sample, the detector allows to obtain both Kikuchi images mainly with a slight shift in perspective and Kikuchi images capturing different sections of the electron diffraction cone. These Kikuchi images obtained from different photodetector positions may taken as basis for sub-pixel intensity interpolation and the calculation of a Kikuchi pattern with super-resolution, e.g., Multi-Frame Super-Resolution. Thus, leading to Kikuchi images with an image resolution higher than the image resolution of a single Kikuchi image obtained by the detector. Further, the Kikuchi images obtained from different photodetector positions may by be stitched together to a Kikuchi image with a larger image section than the image section of a single Kikuchi image obtained by the detector.

In a preferred embodiment of the present invention, the detector head comprises a detection unit with an active surface, the active surface comprises an active surface width, an active surface length and a plurality of pixels with a pixel width and a pixel length, and the means are configured to move the detector head by less than the pixel width or the pixel length, and/or up to at least the active surface width or length.

According to this embodiment, the detector is able to detect Kikuchi images obtained from positions of the active surface which spatially differ from each other by less than a pixel width or length, and/or by up to at least the full active surface width or length. Thus, allowing to obtain Kikuchi images for determining a super-resolution Kikuchi image and/or a Kikuchi image with a significantly increased image section. Preferably, the active area can be moved by more than the active surface width or length so that an increased solid angle of the electron diffraction cone can be covered by an virtually enlarged active surface.

The detection unit comprises preferably a direct electron detector, which may be a pixel array detector or a monolithic active pixel detector, or a photodetector.

The active surface comprises, e.g., silicon or some other suitable material for detecting the incident backscattered electrons, respectively, the incident radiation emitted by the scintillation screen. Preferably, the pixels comprise a pixel length and pixel width in the range of micrometers. The active surface width and the active surface length is preferably in a range of micrometers to centimeters. Further, the photodetector comprises readout electronics electrically connected to the active surface.

In a preferred embodiment of the present invention, the active surface extends along an x-direction and a y-direction, and the means are configured to move the detector head along the x-direction and/or the y-direction and/or a z-direction, wherein the x-direction is perpendicular to the y-direction, and the z-direction is perpendicular to the x-direction and the y-direction. Hence, in case of an EBSD detector or a conventional off-axis TKD detector geometry, the detector head moves preferably within the plane of the active surface of the detection unit, i.e., the x- and y-direction, to effectively cover different parts of the electron diffraction cone. In case of a horizontal on-axis TKD detector geometry, a mirror redirects the backscattered electrons from the sample, respectively, the radiation emitted by a scintillation screen by an angle of 90° before the electrons or the radiation hit the active surface. Thus, in case of horizontal on-axis TKD detector geometry, the detector head moves preferably along the z-direction and the x-direction, wherein the x-direction is defined by a constant distance between the mirror and the active surface along the x-direction, to effectively cover different parts of the electron diffraction cone. According to this embodiment, Kikuchi images obtained by the detector with detector heads at different positions with respect to the detector body share the same gnomonic projection plane. Thus, allowing for a more simple determination of a super-resolution Kikuchi image and/or a Kikuchi image with an increased image section based on the Kikuchi images obtained by the detector.

In a preferred embodiment of the present invention, the means comprise a first linear translation stage for translational movement of the detector head along the x-direction and/or a second linear translation stage for translational movement of the detector head along the y-direction and/or a third linear translation stage for translational movement of the detector head along the z-direction.

Preferably, the first, second and third linear translation stage comprise each a piezo actuator for translational motion. Each piezo actuator is preferably embedded in a guide, wherein the guide is preferably a flexure guide which is configured to allow frictionless and hysteresis-free motion. Further, the linear translation stages comprise crossed roller bearings which allow for a precise and stable motion. Preferably, the first, second and third linear translation stage are motorized linear translation stages.

Further preferred, the linear translation stages comprise an electromagnetic direct drive. In direct drives, the force of the drive element is transmitted directly to the load to be moved without the use of mechanical transmission elements such as coupling, drive screw, or gearhead. The electromagnetic direct drive comprises a permanent magnet and a winding body which are located in the air gap of a magnetic field. When current flows through the winding body, it moves in the magnetic field of the permanent magnet. Linear translation stages with electromagnetic direct drive are compact in size, durable and allow for a nanometer-precise motion.

In a further preferred embodiment of the present invention, the detector comprises a position sensor configured to determine the position of the detector head with respect to the detector body. Preferably, the detector comprises a first position sensor configured to determine the position of the detector head with respect to the detector body along the x-direction and/or a second position sensor configured to determine the position of the detector head with respect to the detector body along the y-direction and/or a third position sensor configured to determine the position of the detector head with respect to the detector body along the z-direction. The position sensor, respectively, the first, second and third position sensor are communicatively connected to the control unit.

Position measurements allow for an accurate determination of the position of the detector head, and thus for higher quality Kikuchi images as the influence of nonlinearity effects, mechanical play, or elastic deformation can be eliminated.

In a preferred embodiment of the present invention, the detector head further comprises a scintillation screen, and the detection unit comprises a photodetector configured to detect incident radiation.

According to the present invention, the detector head comprises a scintillation screen, i.e., a structure that converts incident scattered electrons into electromagnetic radiation, i.e., photons. Exemplarily, the scintillation screen may comprise a phosphor layer configured to emit photons in response to incident backscattered electrons. The scintillation screen is preferably configured to convert the expected dose of incident (back)-scattered electrons into electromagnetic radiation with an intensity and/or a preferred direction of emittance that allows to detect this electromagnetic radiation with a high quantum yield at the photodetector.

The photodetector may be one of a CCD or CMOS photodetector.

In an alternative embodiment, the scintillation screen is not part of the detector head but, for instance, mounted to the detector body so that the detector head comprising the photodetector can also be moved by the means with respect to the scintillation screen.

In a preferred embodiment of the present invention, the detector body comprises a body mounting portion configured to be mounted to a scanning electron microscope chamber port so that the means and the detector head reaches within a scanning electron microscope chamber. Common SEMs comprise at least one chamber port for mounting electron microscope accessory, such as detectors, cameras, sample preparation means or the like. The geometry and fastening systems of those SEM chamber ports are usually standardized, at least for a given manufacturer. Hence, for a given electron microscope, the body mounting portion has a defined configuration. For the skilled person it is a standard task to determine the configuration of the body mounting portion with respect to a certain SEM and a required mounting quality.

Usually, a SEM chamber port comprises at least one mounting flange, such as e.g., a circular mounting flange, e.g., circumcising a mounting aperture in an outer wall of the SEM. The mounting flange may further comprise sealing means, such as e.g., mounting grooves for inserting vacuum seals. However, also flat vacuum gaskets might be used with the mounting flange. Further, the mounting flange usually comprises mounting means, such as e.g., screw holes within the mounting flange. However, other fastening means providing a form and/or force closure between the mounting flange and a mounted component might be used. The mounting flange of the chamber port might be external or internal of the SEM outer wall. Exemplarily, a microscope accessory might also be inserted into an opening of an SEM outer wall and secured therein by a bayonet fastening mechanism and sealing means.

According to the present invention, the body mounting portion is configured to be mounted to such a SEM chamber port of a SEM. In a preferred embodiment, the body mounting portion comprises a first mounting flange that is configured to be mounted to a mounting flange of a SEM chamber port. In particular, the size of the first mounting flange may be adapted to the size of the mounting flange. Further preferred, the positioning of bores, screw holes and/or mounting structures for sealing means (e.g., sealing grooves) may be adapted to the positioning of the corresponding elements on the SEM mounting flange.

In a preferred embodiment of the present invention, the detector body comprises a vacuum seal configured to lead cables to the means and the detector head, and to seal the detector body against the scanning electron microscope chamber. Due to control and power supply units, read-out electronics of the photodetector or cooling means, the detector body is quite bulky and, thus, preferably sits outside of the SEM chamber. As the means and the photodetector, which are configured to be placed inside the SEM chamber, may still depend on wired connections to control units and read-out electronics placed in the detector body, the vacuum seal ensures both the passage of the corresponding wires and lines necessary for the functioning of the means and the photodetector, and the sealing of the detector body against the vacuum in the SEM chamber.

In a preferred embodiment of the present invention, the detector further comprises an objective lens disposed between the scintillation screen and the photodetector. Preferably, the objective lens is part of the detector head and disposed adjacent to the photodetector. This allows for precisely setting the properties of imaging the incident radiation onto the active surface of the photodetector.

In a further preferred embodiment of the present invention, the detector head further comprises a fiber optical taper upstream the photodetector with respect to a propagation direction of the incident radiation. The fiber optical taper is preferably formed by a coherent arrangement of fibers that are arranged in a surface-to-surface arrangement forming a first base surface and a smaller second base surface. Therein, the first base surface is facing the detector head and an image signal input to the first base surface is transmitted as a reduced image to the second base surface facing the active surface of the photodetector. Therein, the reduction is defined by a ratio of the first and second base surface.

In a further preferred embodiment of the present invention, the detector further comprises a field lens arranged adjacent to the scintillation screen in propagation direction of the incident radiation. The field lens preferably has a high numerical aperture and allows for capturing a high fraction of the light emitted by the scintillation screen as well as for focusing it on the remaining optical system. Therein, a planar side of the field lens is facing the scintillation screen and the convexly curved side of the field lens is facing away from the scintillation screen. With this embodiment the light efficiency of the detector is maximized.

In a preferred embodiment of the present invention, the detector further comprises a macro lens adjacent to the photodetector and facing the incident radiation, or adjacent to the scintillation screen in a propagation direction of the incident radiation. Preferably, the macro lens has a short focal length and thus allows for minimizing the extension of the detector, particularly along the propagation direction of the incident radiation, i.e., along the optical axis of the detector. This minimizes the mass that needs to be moved by the means.

Another aspect of the invention relates to a method for determining a Kikuchi image, the method comprising irradiating a sample with an electron beam, obtaining a first Kikuchi image comprising detecting electrons diffracted by the sample which lead to the formation of a first Kikuchi pattern on a active surface, moving the active surface, obtaining a second Kikuchi image comprising detecting electrons diffracted by the sample which lead to the formation of a second Kikuchi pattern on the active surface, and determining a third Kikuchi image from the first Kikuchi image and the second Kikuchi image.

The method for determining a Kikuchi image according to the present invention relates to EBSD images and TKD images alike. Irradiating a sample with an electron beam may preferably comprise scanning the sample with a focused electron beam. Determining a third Kikuchi image preferably comprise to determine a third Kikuchi image from more than two Kikuchi images, wherein each of the Kikuchi images is obtained from different photodetector positions.

A method according to the present invention determines a third Kikuchi image with an increased image resolution and/or an increased image section compared to the image resolution, respectively, the image section of the first and second Kikuchi image.

In a preferred embodiment of the present invention, the active surface comprises a active surface width and a active surface length, and moving the active surface comprises moving the active surface by almost the active surface width or the active surface length, and determining the third Kikuchi image from the first Kikuchi image and the second Kikuchi image comprises stitching the first Kikuchi image and the second Kikuchi image together.

According to the method of the present invention, the image section of the third Kikuchi image is significantly increased in one or even two dimensions compared to the image section of the first and the second Kikuchi image. Thus, by moving the active surface the active surface is virtually enlarged. Preferably, the active surface is only moved by a few pixel widths or pixel lengths less than the active surface width or the active surface length so that the first and the second Kikuchi images cover an overlapping image section which facilitates the stitching together of the first and the second Kikuchi image. The third Kikuchi image may be determined from more than two Kikuchi images obtained at different positions of the active surface. Preferably, the active surface may be moved by more than a full active surface width or length, thus, enabling the determination of a third Kikuchi image with an even further increased image section compared to the image section of the obtained Kikuchi images.

In a further preferred embodiment of the present invention, the active surface comprises a plurality of pixels with a pixel width and a pixel length, moving the active surface comprises moving the active surface by less than the pixel width or the pixel length, and the third Kikuchi image is a super-resolution Kikuchi image.

In other words, determining a third Kikuchi pattern preferably comprises interpolating sub-pixel intensity and/or calculating a third Kikuchi pattern with super-resolution, e.g., Multi-Frame Super-Resolution, from the first and the second Kikuchi image. Thus, leading to a Kikuchi image with an image resolution higher than the image resolution of the first and second Kikuchi image. Again, the third Kikuchi image may be determined from more than two Kikuchi images obtained at different positions of the active surface.

In a preferred embodiment of the present invention, the method further comprises moving the active surface by less than the pixel width or the pixel length, obtaining a fourth Kikuchi image comprising detecting electrons diffracted by the sample which lead to the formation of a fourth Kikuchi pattern on the active surface, moving the active surface by less than the pixel width or the pixel length again, obtaining a fifth Kikuchi image comprising detecting electrons diffracted by the sample which lead to the formation of a fifth Kikuchi pattern on the active surface, determining a sixth Kikuchi image from the fourth Kikuchi image and the fifth Kikuchi image comprises stitching the fourth Kikuchi image and the fifth Kikuchi image together, and determining a seventh Kikuchi image from the third Kikuchi image and the sixth Kikuchi image, wherein the seventh Kikuchi image is a super-resolution Kikuchi image.

According to that method, the image stitching of Kikuchi images obtained from significantly different active surface positions is combined with determining a super-resolution Kikuchi image from Kikuchi images with a slightly different perspective yielding Kikuchi images with an increased image section and image resolution at the same time.

In a further preferred embodiment of the present invention, the method comprises, prior to moving the active surface, displaying the first Kikuchi image or features of the first Kikuchi image to a user, and asking the user if the detector head should be moved, to which direction and by which length the active surface should be moved.

The first Kikuchi image and/or features of the first Kikuchi image, e.g., an intensity distribution of the Kikuchi image, are, for instance, displayed on a display device, e.g., a computer screen. Then, a user is asked whether a second Kikuchi image should be obtained, to which direction and to which extent the active surface is to be moved. Further, the user may selectively choose individual sample points at which further Kikuchi images should be taken in order to avoid unnecessary measurements and thus to accelerate measurement speed.

Another aspect of the present invention relates to a detection system for determining a Kikuchi image, the detection system comprising a scanning electron microscope, SEM, with a SEM chamber and at least one SEM chamber port for accessing the SEM chamber, a detector according to the present invention and a control unit configured to perform the method for determining a Kikuchi image according to the present invention. Further, the SEM comprises an electron source, one or more electron lenses, a sample stage and/or a sample holder, a vacuum system and/or the like.

According to this aspect of the present invention, the detector body is preferably mounted to a SEM chamber port such that the detector head and the means configured to move the detector head with respect to the detector body are inserted through the SEM chamber port, extend at least partially into the SEM chamber and the detector head can be moved with respect to the detector body within the SEM chamber. Hence, Kikuchi pattern measurements can be performed with respect to a sample that is positioned at a sample position adjacent to the scintillation screen of the detector head at different photodetector positions.

Another aspect of the present invention relates to a use of a detector for determining a Kikuchi image, wherein the detector comprises a detector body, a detector head configured to detect incident backscattered electrons, and means configured to move the detector head with respect to the detector body. By such use of a detector the advantages as described with respect to the method according to the present invention can be achieved with any apparatus comprising a detector according to the present invention.

Further aspects and preferred embodiments of the present invention result from the dependent claims, the drawings and the following description of the drawings. Different disclosed embodiments are advantageously combined with each other if not stated otherwise.

DETAILED DESCRIPTION OF THE INVENTION

Figure 1:
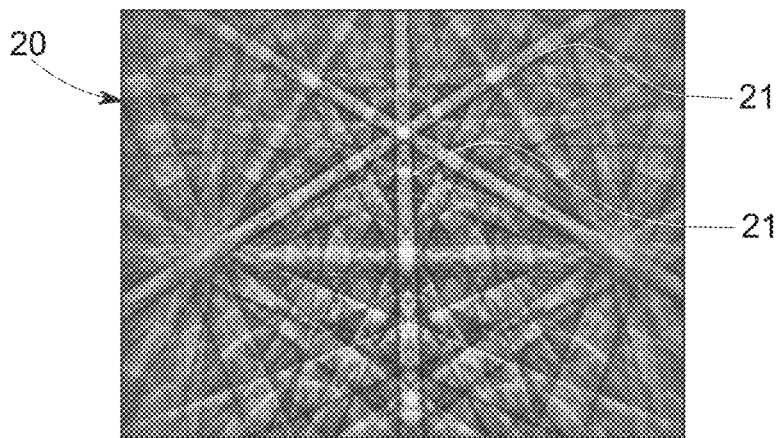
FIG. 1 illustrates a Kikuchi pattern which can be obtained via EBSD or TKD.

Reference will now be made in detail to embodiments, examples of which are illustrated in the accompanying drawings. Effects and features of the exemplary embodiments, and implementation methods thereof will be described with reference to the accompanying drawings. In the drawings, like reference numerals denote like elements, and redundant descriptions are omitted.

FIG. 1 shows an experimentally obtained (detected) Kikuchi pattern 20 for a gallium phosphide sample 14 in a scanning electron microscope 10, SEM. Clearly visible are the Kikuchi bands 21 having an angular width that corresponds to two times the Bragg angle of the corresponding crystal plane of the crystal lattice reflecting the electrons for producing that Kikuchi band. The Kikuchi pattern 20 can be obtained via EBSD or TKD. A detection of such experimental Kikuchi pattern 20 using a SEM 10 with the EBSD technique is described in the following with respect to FIG. 2.

Figure 2:
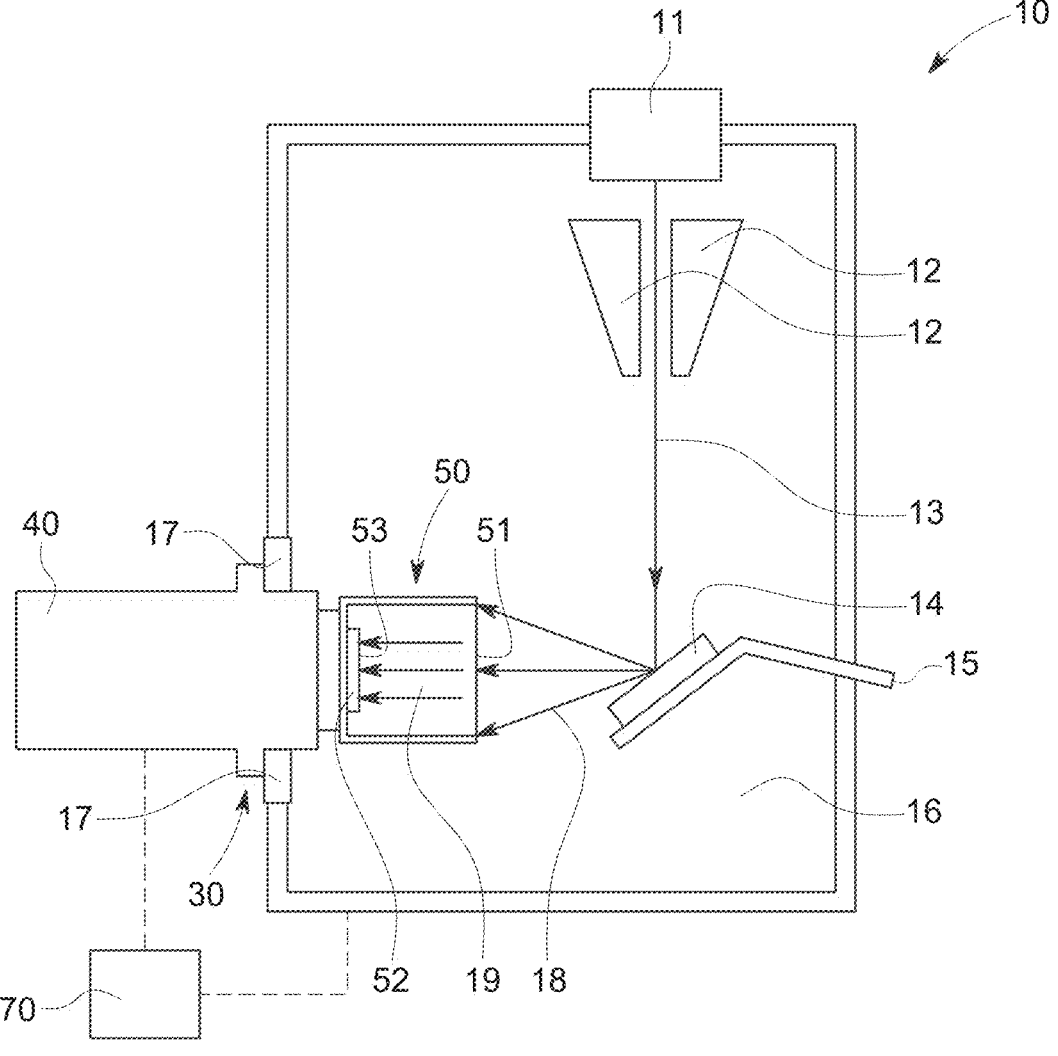
FIG. 2 schematically illustrates a SEM with an EBSD detector.

Referring to FIG. 2, an exemplary embodiment of a detection system for determining a Kikuchi map according to the present invention is shown. The SEM 10 comprises an electron source 11 and a pole piece 12, being part of an electron lens, to focus an electron beam 13 onto a region of a sample 14 which is fixed on a sample holder 15 within the SEM chamber 16. The electrons of the electron beam 13 are diffracted by the sample 14 in this region so that backscattered electrons 18 are incident on a phosphor screen 51 of an EBSD detector 30, which is mounted to the chamber port 17 of the SEM 10 via an annular flange.

The backscattered electrons 18 produce a Kikuchi pattern 20 as a predetermined intensity distribution on the phosphor screen 51. The luminescence 19 emitted by the phosphor screen 51 is in turn detected as a Kikuchi image (as exemplarily shown by FIG. 1) by the active surface 53 of a CCD sensor of the EBSD detector 30.

The SEM 10 and the EBSD detector 30 are connected to a computer 70 for controlling the measurement procedure and for determining improved Kikuchi images from Kikuchi images obtained by the EBSD detector 30, like stitching together Kikuchi images obtained at different positions of the active surface 53, interpolating sup-pixel intensity distributions or calculating super-resolution Kikuchi images based on Kikuchi images obtained from slightly different perspectives.

Figure 3:
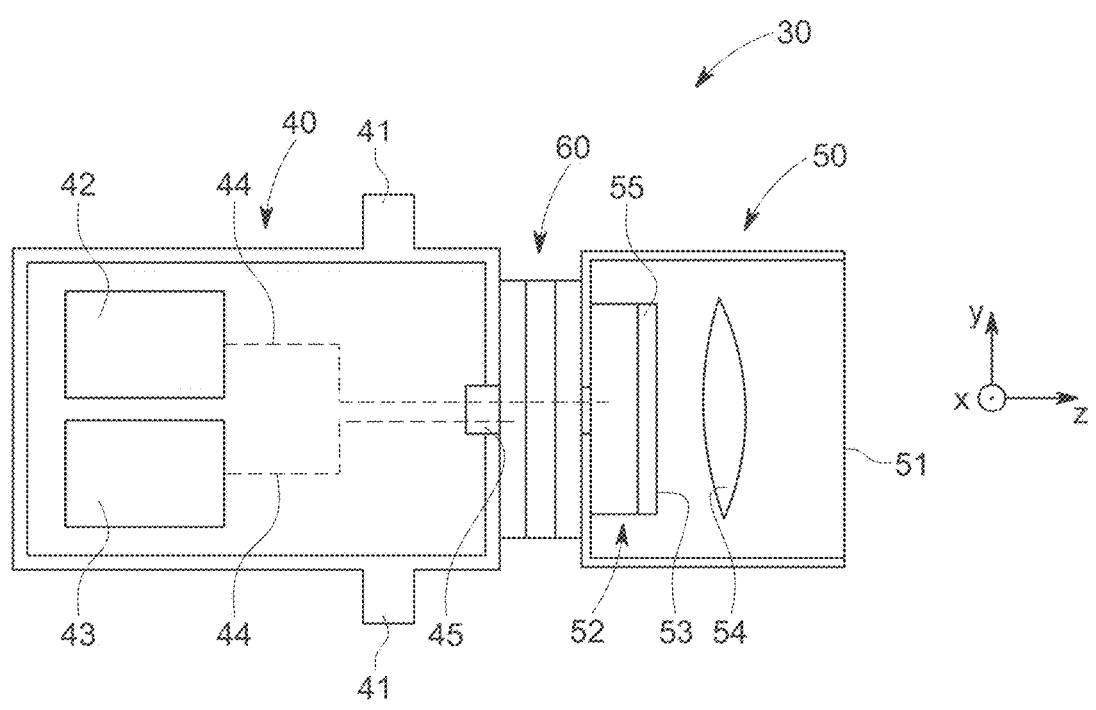
FIG. 3 schematically illustrates an EBSD detector according to a first embodiment of the present invention.

In order to achieve such improved Kikuchi images, the active surface 53 of the EBSD detector 30 can be precisely moved with respect to the SEM 10 chamber, i.e., to a certain electron diffraction cone, when the EBSD detector 30 is mounted to the SEM 10 chamber port 17. FIG. 3 schematically illustrates such an EBSD detector 30 which enables the movement of the active surface 53 of the CCD sensor 55 with respect to a detector body 40.

The EBSD detector 30 comprises a detector head 50 which houses the phosphor screen 51, an objective lens 54 and a detection unit 52 with a CCD sensor 55 with the active surface 53. The active surface 53 comprises 100 times 100 pixels with a pixel width and length in the micrometer range. Also CCD sensors 55 with a higher or lower number of pixels can be integrated in the detector head 50.

Further, the EBSD detector 30 comprises a x- and y-stage 60 which connects the detector head 50 with a detector body 40 and which translates the detector head 50 along the x- and y-direction with respect to the detector body 40. The x- and y-stage 60 enables a precise movement of the detector head 50 from less than the pixel width or length to several times the width or length of the active surface 53.

The detector body 40 of the EBSD detector 30 houses read-out electronics 42 for the CCD sensor 55 and a control unit 43 for the x- and y-stage 60 and comprises an annular flange 41 with sealing means for mounting the EBSD detector 30 to a chamber port 17 of the SEM 10 such that the x- and y-stage 60 and the detector head 50 reach inside the SEM chamber 16, and the detector head 50 can still be moved with respect to the detector body 40. A vacuum seal 45 of the detector body 40 seals the detector body 40 against the vacuum of the SEM 10 chamber and allows a wired communication and power connection 44 between the control unit 43 and the x- and y-stage 60, and between the read-out electronics 42 and the CCD sensor 55.

Figure 4:
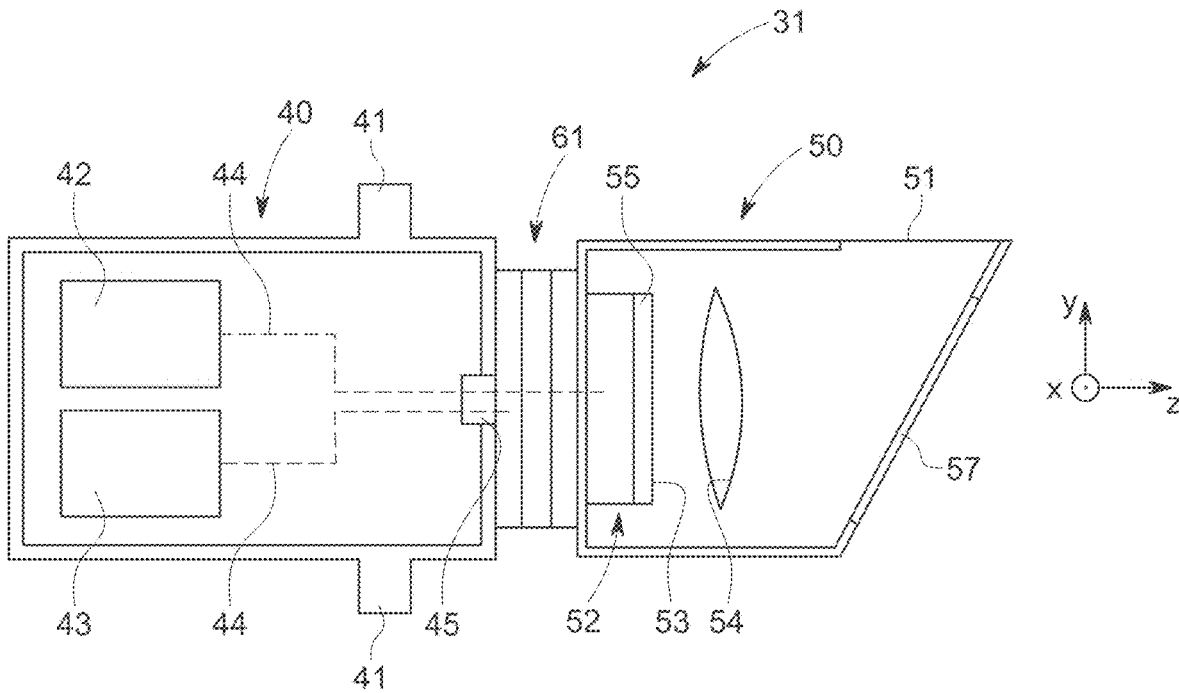
FIG. 4 schematically illustrates a horizontal on-axis TKD detector according to a second embodiment of the present invention.

FIG. 4 schematically illustrates a horizontal on-axis TKD detector 31. Unlike the EBSD detector 30, the horizontal on-axis TKD detector 31 is placed with its phosphor screen 51 underneath the sample 14 so that the transmitted and diffracted electrons are detected downstream the sample 14 in direction of the initially incident electron beam 13.

A mirror 57 redirects the emitted electromagnetic radiation from the phosphor screen 51 to the active surface 53 of the photodetector 50. In order to move the active surface 53 of the horizontal on-axis TKD detector 31 effectively through the transmitted and diffracted electron cone, an x- and z-stage moves the detector head 50 along the x- and z-direction.

Figure 5:
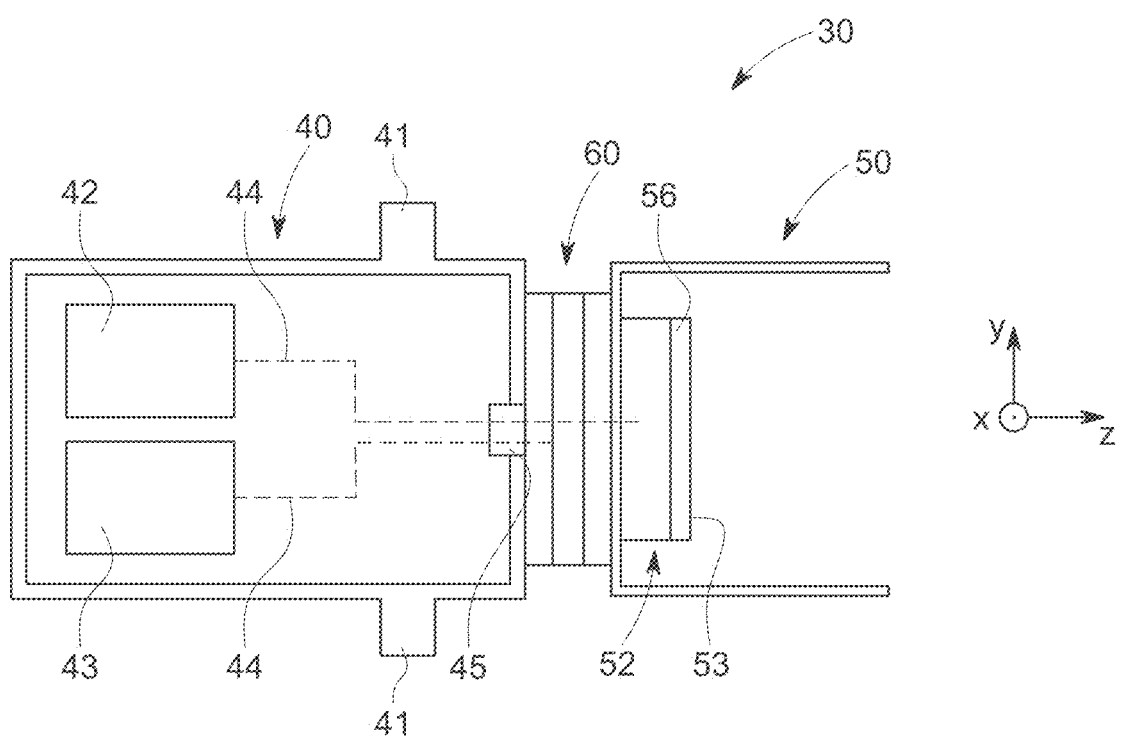
FIG. 5 schematically illustrates an EBSD detector according to a third embodiment of the present invention.

FIG. 5 schematically illustrates an EBSD detector 30 with a direct electron detector 56 instead of a photodetector 55. In this case, a phosphor screen 51 is redundant.

REFERENCE NUMBERS

10 SEM
11 electron source
12 pole piece
13 electron beam 14 sample
15 sample holder
16 SEM chamber
17 chamber port
18 backscattered electrons
19 luminescence
20 Kikuchi pattern
21 Kikuchi bands
30 EBSD detector
31 horizontal on-axis TKD detector
40 detector body
41 annular flange
42 read-out electronics
43 control unit
44 wired communication and power connection
45 vacuum seal
50 detector head
51 phosphor screen
52 detection unit
53 active surface
54 objective lens
55 CCD sensor
56 electron detector
57 mirror
60 x- and y-stage
61 x- and z-stage
70 computer

The invention claimed is:

1. Detector (30, 31) for Kikuchi diffraction, the detector (30, 31) comprising:
   a detector body (40);
   a detector head (50) configured to detect incident backscattered electrons (19);
   means (60, 61) configured to move the detector head (50) with respect to the detector body (40); and
   a control unit (43) which is communicatively connected to the means; and
   wherein the detector (30, 31) further comprises a position sensor configured to determine the position of the detector head (50) with respect to the detector body (40).

2. Detector (30, 31) according to claim 1, wherein the detector head (50) comprises a detection unit (52) with an active surface (53), the active surface (53) comprises an active surface width, an active surface length and a plurality of pixels with a pixel width and a pixel length, and the means (60, 61) are configured to move the detector head (50) by less than the pixel width or the pixel length, and/or up to at least the active surface width or the active surface length.

3. Detector (30, 31) according to claim 2, wherein the active surface extends along an x-direction and a y-direction, and the means (60, 61) are configured to move the detector head (50) along the x-direction and/or the y-direction and/or a z-direction, wherein the x-direction is perpendicular to the y-direction, and the z-direction is perpendicular to the x-direction and the y-direction.

4. Detector (30, 31) according to claim 3, wherein the means (60, 61) comprise a first linear translation stage for translational movement of the detector head (50) along the x-direction and/or a second linear translation stage for translational movement of the detector head (50) along the y-direction and/or a third linear translation stage for translational movement of the detector head (50) along the z-direction.

5. Detector (30, 31) according to claim 2, wherein the detector head (50) further comprises a scintillation screen (51) and the detection unit (52) comprises a photodetector configured to detect incident radiation.

6. Detector (30, 31) according to claim 1, wherein the detector body (40) comprises a body mounting portion (41) configured to be mounted to a scanning electron microscope chamber port (17) so that the means (60, 61) and the detector head (50) reach within a scanning electron microscope chamber (16).

7. Detector (30, 31) according to claim 1, wherein the detector body (40) comprises a vacuum seal (45) configured to lead cables (44) to the means (60, 61) and the detector head (50), and to seal the detector body (40) against a scanning electron microscope chamber (16).

8. Method for determining a Kikuchi image, the method comprising irradiating a sample (14) with an electron beam (13);
   obtaining a first Kikuchi image comprising detecting electrons diffracted by the sample (14) which lead to the formation of a first Kikuchi pattern on an active surface (53);
   moving the active surface (53);
   obtaining a second Kikuchi image comprising detecting electrons diffracted by the sample (14) which lead to the formation of a second Kikuchi pattern on the active surface (53); and
   determining a third Kikuchi image from the first Kikuchi image and the second Kikuchi image.

9. Method for determining a Kikuchi image according to claim 8, wherein the active surface (53) comprises an active surface width and an active surface length, and moving the active surface (53) comprises moving the active surface (53) by almost the active surface width or the active surface length, and determining the third Kikuchi image from the first Kikuchi image and the second Kikuchi image comprises stitching the first Kikuchi image and the second Kikuchi image together.

10. Method for determining a Kikuchi image according to claim 8, wherein the active surface (53) comprises a plurality of pixels with a pixel width and a pixel length, moving the active surface (53) comprises moving the active surface (53) by less than the pixel width or the pixel length, and the third Kikuchi image is a super-resolution Kikuchi image.

11. Method for determining a Kikuchi image according to claim 10, the method further comprises:
    moving the active surface (53) by less than the pixel width or the pixel length;
    obtaining a fourth Kikuchi image comprising detecting electrons diffracted by the sample (14) which lead to the formation of a fourth Kikuchi pattern on the active surface (53);
    moving the active surface (53) by less than the pixel width or the pixel length again;
    obtaining a fifth Kikuchi image comprising detecting electrons diffracted by the sample (14) which lead to the formation of a fifth Kikuchi pattern on the active surface (53);
    determining a sixth Kikuchi image from the fourth Kikuchi image and the fifth Kikuchi image comprises stitching the fourth Kikuchi image and the fifth Kikuchi image together; and
    determining a seventh Kikuchi image from the third Kikuchi image and the sixth Kikuchi image, wherein the seventh Kikuchi image is a super-resolution Kikuchi image.

12. Method for determining a Kikuchi image according to claim 8, wherein the method further comprises, prior to moving the active surface (53):

displaying the first Kikuchi image or features of the first Kikuchi image; and requesting an input if a detector head (50) should be moved, to which direction and by which length the active surface (53) should be moved.

13. Detection system for determining a Kikuchi image, comprising:

a scanning electron microscope (10), SEM, with a SEM chamber (16) and at least one SEM chamber port (17) for accessing the SEM chamber (16);

a detector (30, 31) according to claim 1; and a control unit (70) configured to perform method for determining a Kikuchi image, the method comprising irradiating a sample (14) with an electron beam (13);

obtaining a first Kikuchi image comprising detecting electrons diffracted by the sample (14) which lead to the formation of a first Kikuchi pattern on an active surface (53);

moving the active surface (53);

obtaining a second Kikuchi image comprising detecting electrons diffracted by the sample (14) which lead to the formation of a second Kikuchi pattern on the active surface (53); and determining a third Kikuchi image from the first Kikuchi image and the second Kikuchi image.

\* \* \* \* \*